United States Patent
Omori et al.

(10) Patent No.: US 9,457,955 B2
(45) Date of Patent: Oct. 4, 2016

(54) ARTICLE STORAGE FACILITY

(71) Applicant: Daifuku Co., Ltd., Osaka-shi (JP)

(72) Inventors: Kazuya Omori, Shiga (JP); Hiromichi Aoki, Shiga (JP); Hideo Yoshioka, Shiga (JP); Sadato Matsuki, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/937,148

(22) Filed: Nov. 10, 2015

(65) Prior Publication Data

US 2016/0130084 A1    May 12, 2016

(30) Foreign Application Priority Data

Nov. 12, 2014  (JP) ................. 2014-230062

(51) Int. Cl.
| B65G 1/02 | (2006.01) |
| G05B 15/02 | (2006.01) |
| H01L 21/67 | (2006.01) |
| H01L 21/673 | (2006.01) |
| H01L 21/677 | (2006.01) |

(52) U.S. Cl.
CPC ............. B65G 1/02 (2013.01); G05B 15/02 (2013.01); H01L 21/67259 (2013.01); H01L 21/67379 (2013.01); H01L 21/67769 (2013.01); H01L 21/67775 (2013.01)

(58) Field of Classification Search
CPC ...................................................... B65G 1/02
See application file for complete search history.

(56) References Cited

U.S. PATENT DOCUMENTS

| 4,934,767 A * | 6/1990 | Hoyt, III ........... H01L 21/67769 211/1.57 |
| 7,955,044 B2 * | 6/2011 | Moriya ..................... B65G 1/02 414/806 |
| 8,113,758 B2 * | 2/2012 | Hanel ..................... A47B 57/10 211/190 |
| 8,196,732 B2 * | 6/2012 | Fatula, Jr. ............... B66C 1/663 198/346.2 |
| 8,231,324 B2 * | 7/2012 | Yoshida ............... B65G 1/0407 414/280 |
| 8,942,844 B2 | 1/2015 | Takahara et al. |
| 9,045,282 B2 * | 6/2015 | Yoshioka ................. B65G 1/02 |
| 9,187,300 B2 * | 11/2015 | Yoshioka ............... B65G 1/026 |
| 9,245,782 B2 * | 1/2016 | Yoshioka .......... H01L 21/67359 |
| 9,359,135 B2 * | 6/2016 | Nagamine ................ B65G 1/02 |
| 2014/0079516 A1 * | 3/2014 | Chen ........................ B65G 1/02 414/298 |

FOREIGN PATENT DOCUMENTS

JP        2013133193 A        7/2013

* cited by examiner

*Primary Examiner* — Gene Crawford
*Assistant Examiner* — Thomas Randazzo
(74) *Attorney, Agent, or Firm* — The Webb Law Firm (57) ABSTRACT

An article storage facility includes a measuring jig for measuring an amount of tilt of a support body. A controller for controlling operation of an article transport device performs a tilt measurement control for controlling operation of the article transport device to transport the measuring jig sequentially to each of a plurality of measurement target storage sections which is all or part of the plurality of storage sections.

6 Claims, 6 Drawing Sheets

ARTICLE STORAGE FACILITY

CROSS-REFERENCE TO RELATED APPLICATION

This application claims priority to Japanese Patent Application No. 2014-230062 filed Nov. 12, 2014, the disclosure of which is hereby incorporated in its entirety by reference.

FIELD OF THE INVENTION

The present invention relates to an article storage facility comprising an article storage rack having a plurality of storage sections for storing articles, the storage sections being arranged along a vertical direction and along a rack lateral direction, an article transport device for transporting articles to the plurality of storage sections, a controller for controlling operation of the article transport device, wherein each of the plurality of storage sections includes a support body for receiving and supporting an article, and wherein the controller is configured to perform an article transport control for controlling operation of the article transport device to transport an article between an article support portion and any one of the plurality of the storage sections.

BACKGROUND

An example of an article storage facilities such as one described above is described in JP Publication of Application No. 2013-133193 (Patent Document 1). In such a article storage facility, articles are stored in storage sections with the articles received and supported on support bodies. And if a support body is tilted or inclined with respect to the horizontal, the article received and supported by the support body would also become tilted with respect to the horizontal; thus, it becomes easier or more likely for the article stored in the storage section to fall from the support body. In addition, when a support body is tilted, the position of the support body is displaced in the vertical direction; therefore, there is a possibility that the article may interfere, or come into contact, with the support body when storing the article in the storage section with an article transport device, or when taking out the article from the storage section. In addition, when the article is a FOUP for holding semiconductor substrates, and is received and supported by the support body of a storage section, and if an inject portion of an inactive gas supplying device is configured to be connected to the article under the weight of the article, the center of gravity of the article becomes offset when the article is tilted with respect to the horizontal, resulting in a possibility that the inject portion may not be connected properly to the article. Thus, when the support body is tilted, it is necessary to correct the attitude of the support body into a proper installed state.

To this end, conventionally, when an article storage rack is newly installed, for example, a worker would measure for any tilt or inclination of support bodies using a level. And when the amount of tilt of a measured support body is greater than the amount in the proper installed state by more than a permissible angle, the worker would correct the attitude of the support body to set it to the proper installed state.

SUMMARY OF THE INVENTION

However, a plurality of storage sections are arranged both along the vertical direction and along a rack lateral direction in an article storage rack; thus, when measuring for any tilt of support bodies using an instrument as described above, a worker would climb up and down a stepladder to measure for any tilt of the support bodies in the plurality of storage sections arranged along the vertical direction, and would move the stepladder along the rack lateral direction to measure for any tilt of the support bodies in the storage sections arranged along the rack lateral direction. Thus, a worker would have to climb up and down the stepladder and to move the stepladder along the rack lateral direction when measuring for any tilt of the support bodies provided to the plurality of storage sections; thus, a large amount of time is required to complete the measurement for any tilt of the support bodies in the plurality of storage sections.

Thus, it is desirable to reduce the amount of time required to take measurement for any tilt of the support bodies in the plurality of storage sections in an article storage rack. In addition, it would be desirable to reduce any increase in cost associated with the reduction in the amount of time required to take measurements.

To this end, an article storage facility is desired in which the amount of time required to take measurements is reduced while any increase in cost associated with it is reduced as well.

The feature of an article storage facility in light of the points discussed above is that the facility comprises: an article storage rack having a plurality of storage sections for storing articles, the storage sections being arranged along a vertical direction and along a rack lateral direction; an article transport device for transporting articles to the plurality of storage sections; a controller for controlling operation of the article transport device; wherein each of the plurality of storage sections includes a support body for receiving and supporting an article, wherein the controller is configured to perform an article transport control for controlling operation of the article transport device to transport an article between an article support portion and any one of the plurality of the storage sections, wherein a measuring jig is provided for measuring an amount of tilt of the support body with respect to the horizontal with the measuring jig received and supported by the support body, wherein the controller is configured to perform a tilt measurement control for controlling operation of the article transport device to transport the measuring jig sequentially to each of a plurality of measurement target storage sections which is all or a part of the plurality of storage sections, such that, after causing the measuring jig to be transported to cause the measuring jig to be received and supported by the support body of one measurement target storage section, the controller causes the measuring jig to be transported to cause the measuring jig to be received and supported by the support body of another measurement target storage section that is designated as being next in a set order defined in advance.

With the arrangement described above, the measuring jig is transported sequentially to each of the plurality of measurement target storage sections by the article transport device when the controller performs the tilt measurement control. And the measuring jig transported to the measurement target storage section is transported to be caused to be received and supported by the support body; thus, the amount of tilt of the support body with respect to the horizontal can be measured by the measuring jig for each of the measurement target storage sections to which the measuring jig is sequentially transported. A worker can then correct the attitudes of the tilted support bodies to a proper installed state based on the measurements of the measuring jig.

As such, by transporting the measuring jig with the article transport device and measuring the amount of tilt of the support bodies of the plurality of measurement target storage sections, the amount of time required to take the measurements can be reduced compared to when a worker takes measurements while having to climb up and down the stepladder, and to move the stepladder along the rack lateral direction.

In addition, by making use of the article transport device, which is already provided to transport articles, to transport the measuring jig, it is not necessary to provide a separate device for transporting the measuring jig. Thus, any increase in cost that may be associated with the reduction in the amount of time for taking measurements may be reduced.

DETAILED DESCRIPTION

Embodiments of an article storage facility are described next with reference to the drawings.

Figure 1:
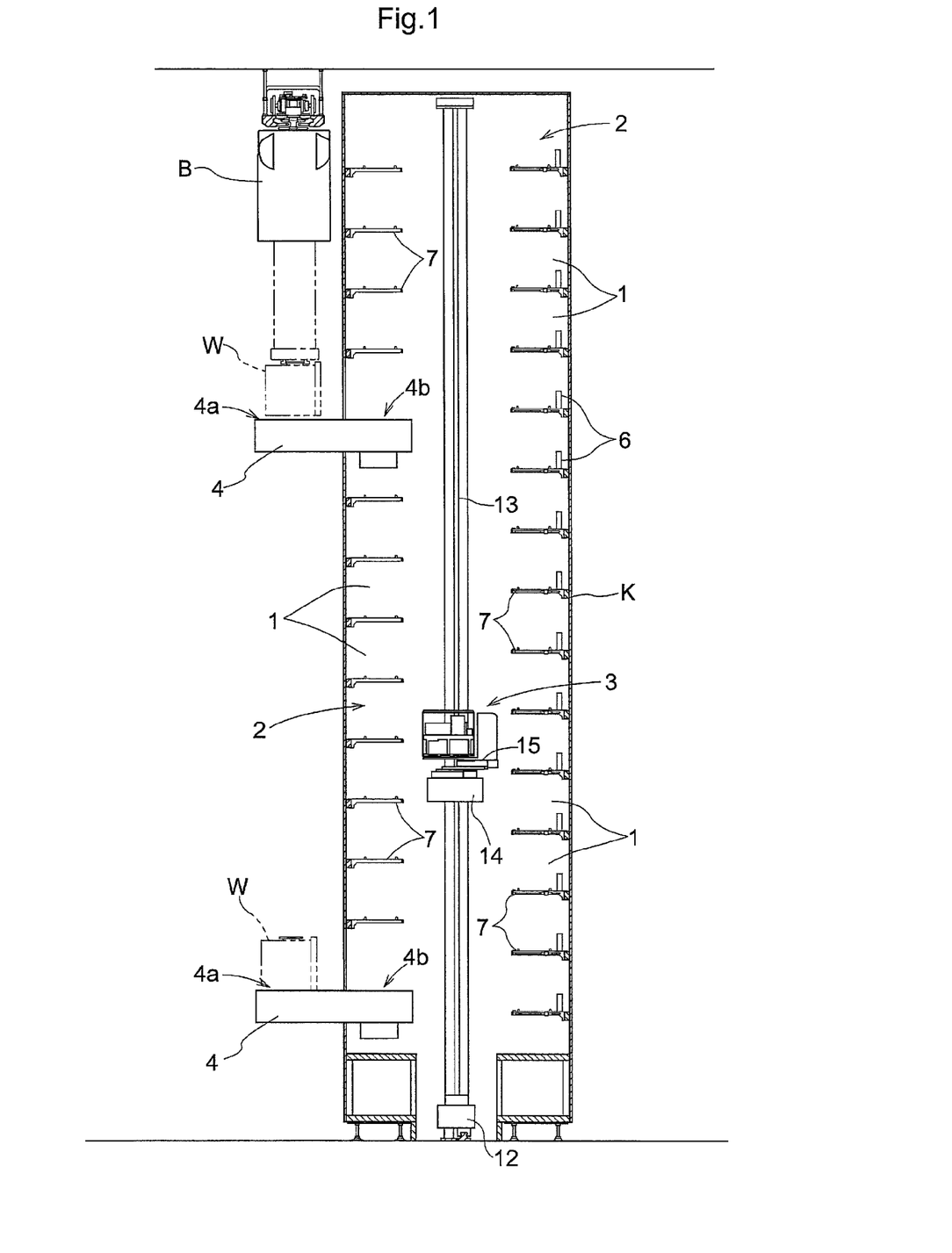
FIG. 1 is a side view of an article storage facility.

As shown in FIG. 1, an article storage facility includes article storage racks 2 having a plurality of storage sections 1 for storing containers W which are the articles, a stacker crane 3 which functions as an article transport device for transporting the containers W one container W at a time, walls K for covering the installation space in which the article storage racks 2 and the stacker crane 3 are installed, and carry-in-and-out conveyors 4 each of which extends through a wall K, for supporting and transporting the containers W.

Figure 2:
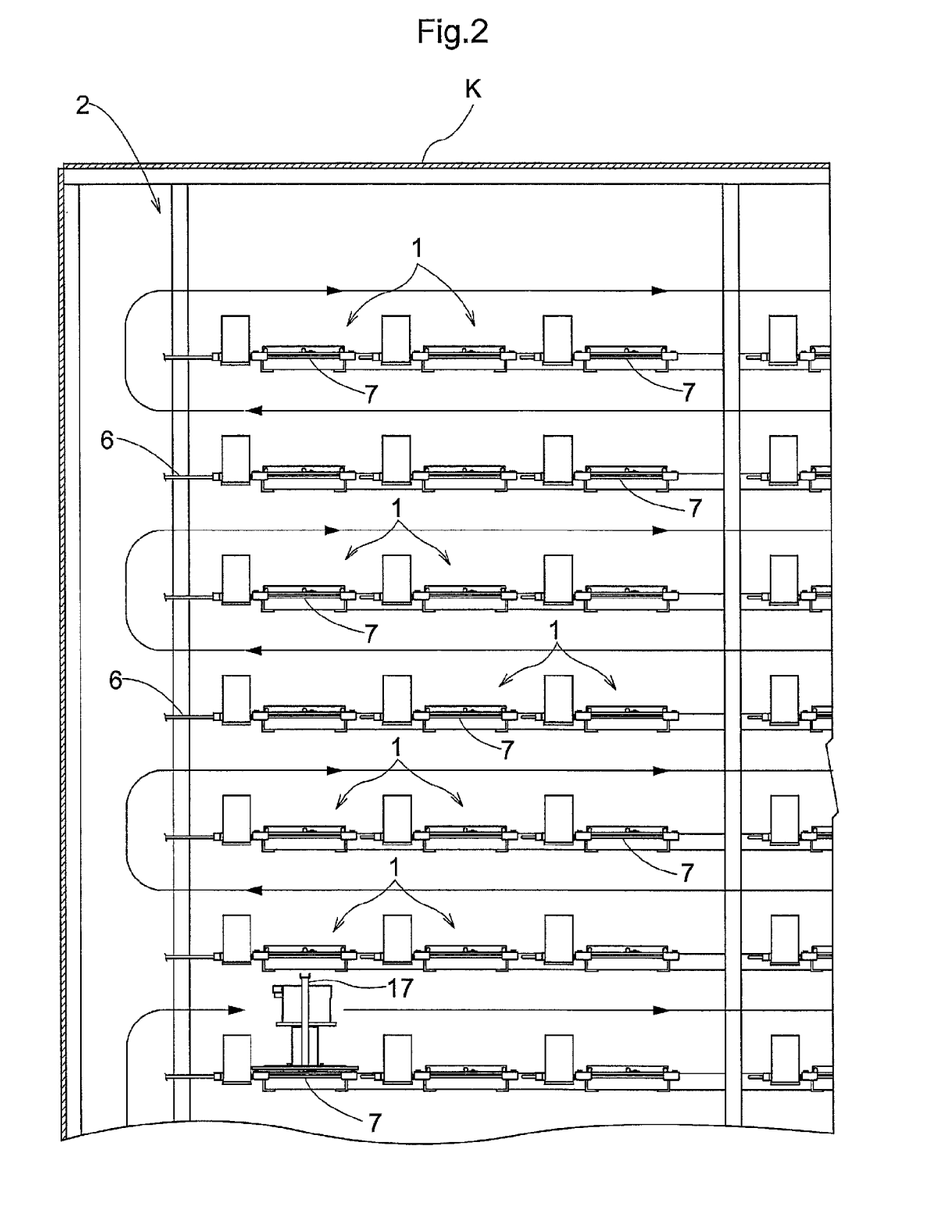
FIG. 2 is a front view showing a part of a article storage rack.

As shown in FIG. 1, a pair of article storage racks 2 are provided such that they face each other. As shown in FIGS. 1 and 2, nitrogen gas supplying devices 6 are provided in one of the pair of article storage racks 2 (article storage rack 2 on the right in FIG. 1) for supplying nitrogen gas, as inactive gas, to the containers W stored in the storage sections 1. And that one of the pair of article storage racks 2 is configured to function as a purging article storage rack 2. In addition, As shown in FIG. 1, the nitrogen gas supplying devices 6 are not provided in the other of the pair of article storage racks 2 (article storage rack 2 on the left in FIG. 1). And said the other of the pair of article storage racks 2 is configured to function as a non-purging article storage rack 2.

Figure 3:
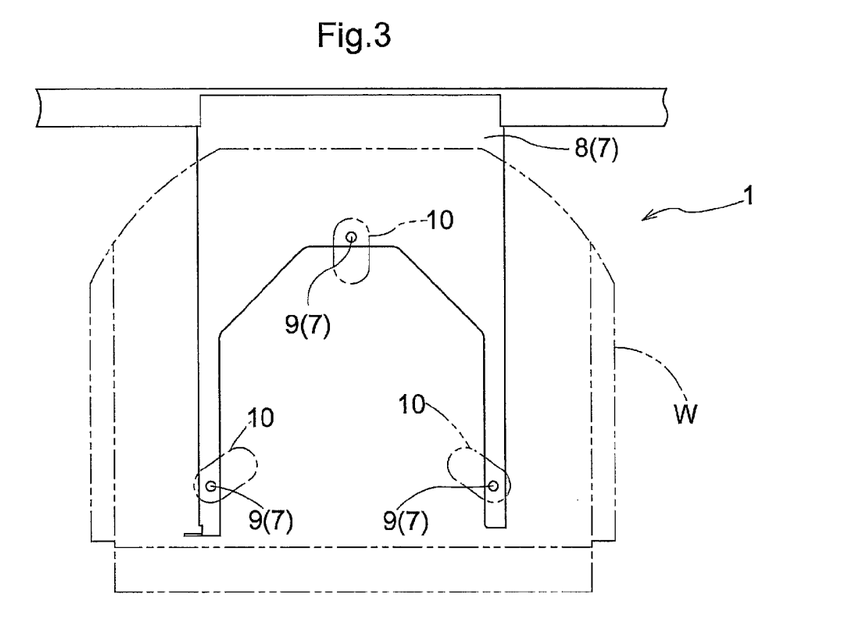
FIG. 3 is a plan view showing a support body supporting a container.

As shown in FIGS. 1 and 2, a plurality of storage sections 1 are provided to each of the pair of article storage racks 2 such that the storage sections 1 are arranged one on top of another along the vertical direction and one next to another along the rack lateral direction. And as shown in FIG. 3, each of a plurality of storage sections 1 includes a support body 7 for receiving and supporting a container W stored in the storage section 1. Note that the plurality of storage sections 1 refer to all of the storage sections 1 provided to the pair of article storage racks 2.

As shown in FIG. 3, each support body 7 includes a plate-shaped plate member 8 and three positioning projections 9. Note that the positioning projections 9 are, or correspond to, the plurality of support members for receiving and supporting a container W in a proper attitude defined in advance.

The plate member 8 is formed to have a shape with a part cut out from a rectangle, and is formed to have a general U-shape with straight lines connected at corners in plan view. In addition, each plate member 8 has a back end portion, along the rack fore and aft direction, connected to a structural member of the article storage rack 2. The positioning projection 9 is provided to the plate member at each of three locations around the peripheral edge portion of the cut-out in the plate member 8 such that the positioning projections 9 project upwardly from the top surface of the plate member 8.

As shown in FIG. 3, provided to a bottom surface of the container W are three recessed portions 10 which are recessed upwardly, a gas supply opening (not shown) for introducing nitrogen gas into the container W with a use of the nitrogen gas supplying device 6, and a discharge opening (not shown) for discharging the gas from the container W.

And when a container W is stored in a storage section 1, the positioning projections 9 engage, from below, respective recessed portions 10 of the container W so that any horizontal displacement of the container W is restricted by the three positioning projections 9 in engagement with the recessed portions 10 and so that the container is received and supported by the three positioning projections 9 in engagement with the recessed portions 10.

In addition, when a container W is stored in a storage section 1 of the purging article storage rack 2, the container W is received and supported by the three positioning projections 9 and the inject portion, for injecting nitrogen gas, of the nitrogen gas supplying device 6 is connected to the gas supply opening.

In the present embodiment, each container W is a FOUP (Front Opening Unified Pod) for holding and carrying semiconductor substrates. In addition, the state in which the upper ends of the three positioning projections 9 are all at the same height is the proper installed state of the support body 7.

As shown in FIG. 1, each of the carry-in-and-out conveyors 4 is configured to support and transport the containers W between an external transfer location 4a located outside the wall K and an internal transfer location 4b located inside the wall K. A ceiling, or overhead, transport vehicle B loads or unloads a container W to or from the external transfer location 4a of the carry-in-and-out conveyor 4 installed at a higher location whereas a human worker loads or unloads a container W to or from the external transfer location 4a of the carry-in-and-out conveyor 4 installed at a lower location.

In the article transport facility, when a container W is placed on the external transfer location 4a of a carry-in-and-out conveyor 4, the container W is supported and transported from the external transfer location 4a to the internal transfer location 4b by the carry-in-and-out conveyor 4, and is subsequently transported from the internal transfer location 4b to a storage section 1 by the stacker crane 3.

In addition, in the article transport facility, when a container W is transported from a storage section 1 to the internal transfer location 4b of a carry-in-and-out conveyor 4 by the stacker crane 3, the container W is supported and transported from the internal transfer location 4b to the external transfer location 4a by the carry-in-and-out conveyor 4, and is subsequently unloaded from the external transfer location 4a either by the ceiling transport vehicle B or by a human worker.

And when nitrogen gas needs to be supplied to a container W stored in the non-purging storage section 1 of the article storage rack 2, the container W is transported from the storage section 1 of the non-purging article storage rack 2 to a storage section 1 in the purging article storage rack 2 by the stacker crane 3. In addition, when the supplying of the nitrogen gas to the container W stored in the storage section 1 of the purging article storage rack 2 is completed and the container W needs to be retrieved or removed from the purging storage section 1, the container W is transported from the storage section 1 of the article storage rack 2 to a storage section 1 of the non-purging article storage rack 2 by the stacker crane 3.

Thus, the stacker crane 3 transports the containers W, one container W at a time, between either of the internal transfer locations 4b and any one of the storage sections 1 as well as between one storage section 1 to another storage section 1. In the present embodiment, the internal transfer location 4b is, or corresponds to, the "article support portion". In the present embodiment, each article support portion functions as the carry in and out portion.

As shown in FIG. 1, the stacker crane 3 includes a travel carriage 12 configured to travel along the rack lateral direction along a travel path formed between the pair of article storage racks 2, a vertically movable platform 14 configured to be moved vertically, or raised and lowered, along a mast 13 provided to the travel carriage 12 to stand erect thereon, and a transfer device 15 which is supported by the vertically movable platform 14 and is configured to transfer a container W between itself and a storage section 1 or the internal transfer location 4b of a carry-in-and-out conveyor 4.

The transfer device 15 is provided with an article holder 15a, for receiving and supporting the container W, such that the article holder 15a can be projected and retracted between a retracted position (position shown with solid lines in FIGS. 5 and 6) in which the article holder 15a is retracted toward the vertically movable platform 14, and a projected position (position shown with dashed lines in FIGS. 5 and 6) in which the article holder 15a is projected away from the vertically movable platform 14 along the rack fore and aft direction.

In addition, the transfer device 15 is configured to be able to project the article holder 15a selectively either toward the purging article storage rack 2 or toward the non-purging article storage rack 2, by causing the article holder 15a to be rotated or turned about a vertical axis, so as to be able to transfer a container W to or from any one of the storage sections 1 of either of the pair of article storage racks 2. Note that the projecting and retracting direction of the article holder 15a coincides with the rack fore and aft direction.

The article storage facility is provided with a measuring jig 17 which is a device for measuring the amount of tilt of the support body 7 with respect to the horizontal when the measuring jig 17 is received and supported by the support body 7.

Figure 4:
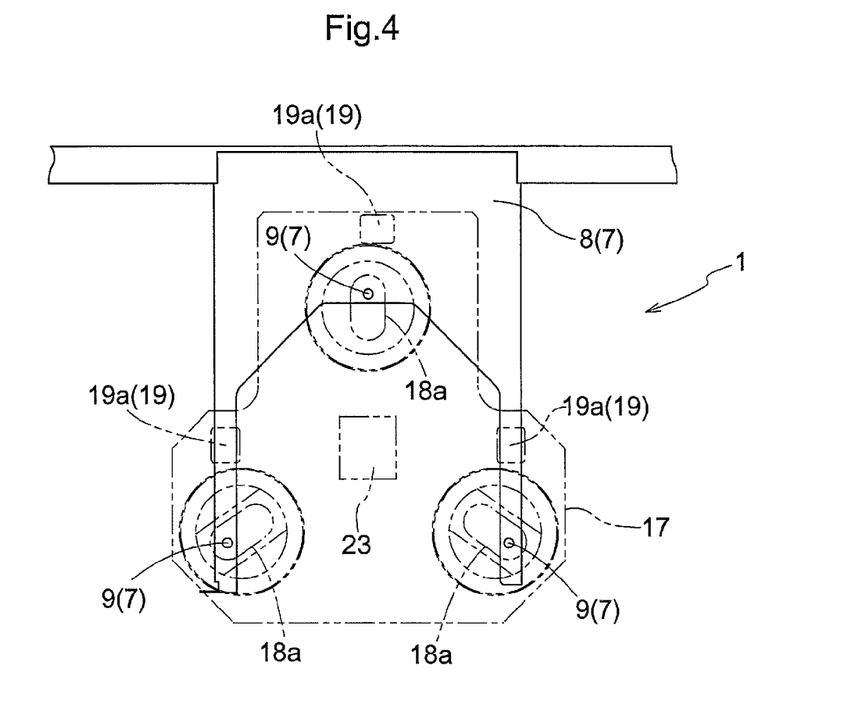
FIG. 4 is a plan view showing the support body supporting a measuring jig.
Figure 5:
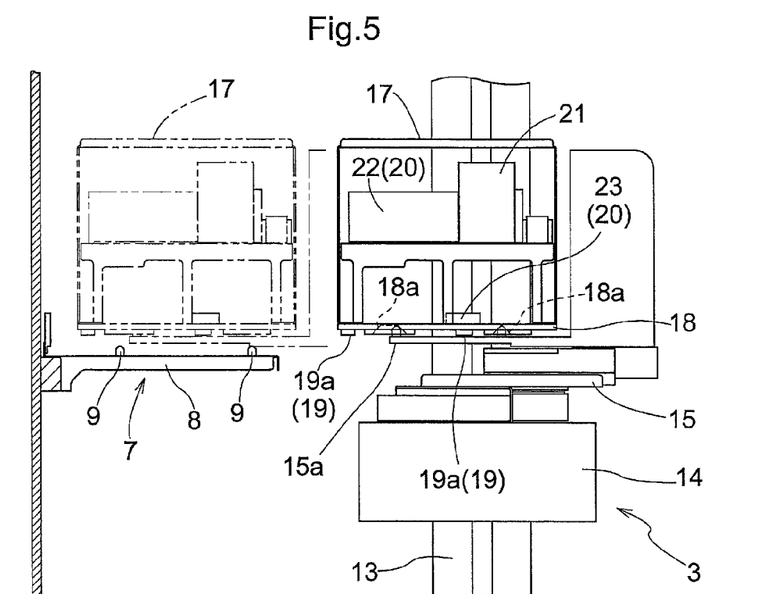
FIG. 5 is a side view showing a vertically movable platform located at an unloading vertical stop position.
Figure 6:
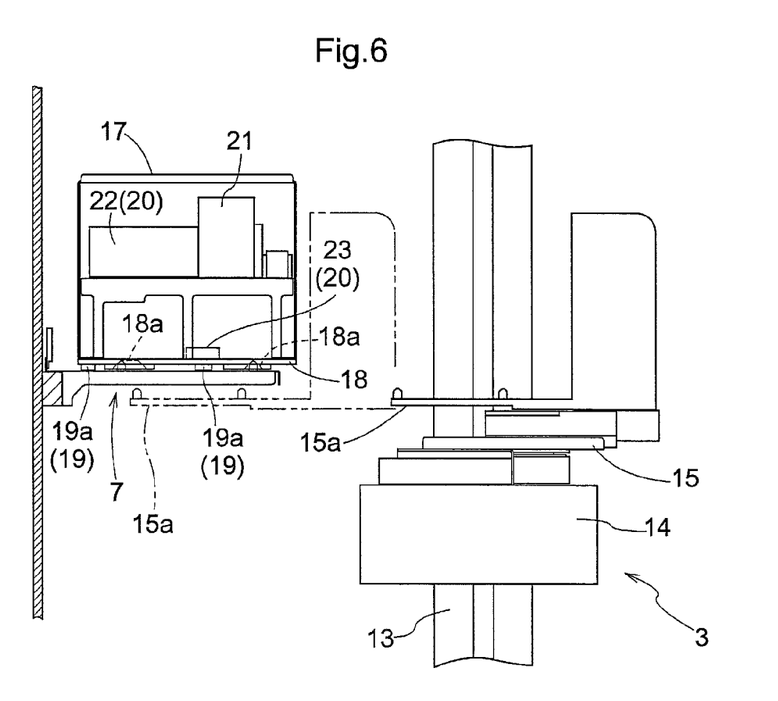
FIG. 6 is a side view showing the vertically movable platform located at a pick up vertical stop position.

As shown in FIGS. 4-6, the measuring jig 17 includes a supported portion 18 configured to be received and supported by the three positioning projections 9 in proper attitude, a detecting portion 19 for detecting the resting state of the supported portion 18 received and supported by the support body 7, a measuring portion 20 for measuring the amount of tilt of the support body 7, and a battery 21 for supplying electric power to the measuring portion 20, etc. The detecting portion 19 detects the resting state of the measuring jig 17 with respect to the support body 7. In addition, the measuring portion 20 is supported by the supported portion 18.

The engaging grooves 18a, each of which is recessed upwardly, are formed in the supported portion 18. And an engaging groove 18a is formed in the supported portion 18 at each of three locations such that each of the three positioning projections 9 engages the corresponding one of the engaging grooves 18a. The detecting portion 19 consists of three seating sensors (i.e. contact sensors) 19a each of which is provided near the corresponding one of the three engaging grooves 18a.

Each seating sensor 19a is configured to come into contact with the plate member 8 of the support body 7 when a positioning projection 9 engages the corresponding engaging groove 18a. All three seating sensors 19a detect the plate member 8 when the measuring jig 17 is supported in the proper attitude by the support body 7 of the storage section 1. In addition, when the measuring jig 17 is not supported in the proper attitude by the support body 7 of the storage section 1, such as when a peripheral edge portion of an engaging groove 18a rests on the positioning projection 9, at least one or all of the three seating sensors 19a does not, or do not, detect the plate member 8.

The detecting portion 19 detects that the supported portion 18 is received and supported in the proper attitude by the support body 7 and therefore that the measuring jig 17 has been seated or rested on the support body 7, when all of the three seating sensors 19a are detecting the plate member 8.

Incidentally, the three seating sensors 19a are provided to the measuring jig 17 such that none of the three seating sensors 19a would come into contact with the article holder 15a when the measuring jig 17 is received and supported by the article holder 15a of the transfer device 15.

The measuring portion 20 includes a measurement controller 22 having memory and a level 23 (which can be any known tilt measuring device such as tiltmeter, inclinometer, or any type of level) for measuring the amount of tilt of the support body 7.

The measurement controller 22 is configured to measure the amount of tilt of the support body 7 with the level 23 after expiration of measurement start set period after the detecting portion 19 detects the resting state of the supported portion 18 (i.e. seating or resting of the measuring jig 17), and to store the measured value measured by the level 23 in the memory. As such, the measuring portion 20 is configured to measure the amount of tilt of the support body 7 with the measuring portion 20 after the measurement start set period has expired or elapsed after the detecting portion 19 detects the resting state of the supported portion 18. That is, the measurement by the measuring portion 20 is performed after the measurement start set period has elapsed or expired after the detecting portion 19 detects that the measuring jig 17 is received and supported in a predetermined proper attitude by the support body 7.

Figure 9:
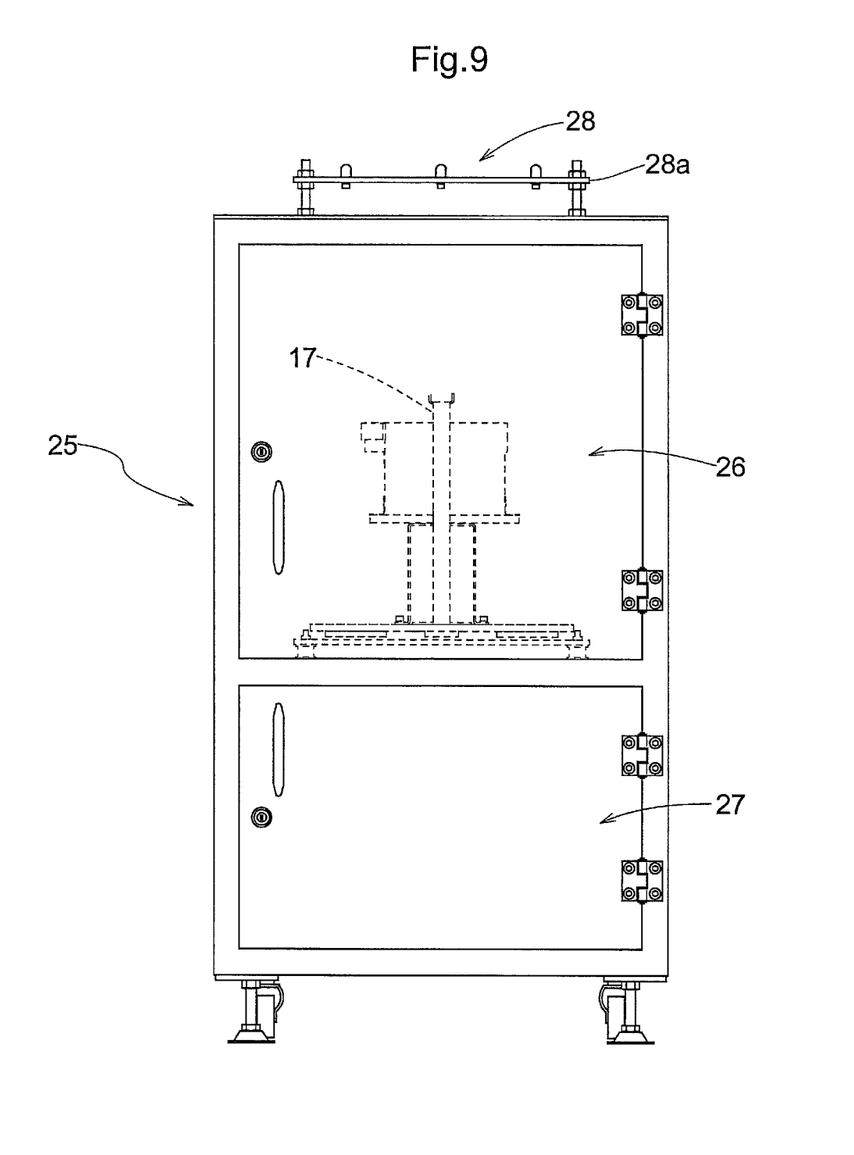
FIG. 9 is a front view of a jig storage rack.

The measuring jig 17 is usually stored in a jig storage rack 25 shown in FIG. 9, and is taken out from the jig storage rack 25 and used when needed. When using the measuring jig 17, the measuring jig is taken out from the jig storage rack 25 by a human worker, and is moved to a storage section 1 which is designated in advance as the starting point of the measurement (referred to as the measurement start point storage section) among the plurality of storage sections 1. Incidentally, the leftmost and lowest storage section 1 among the plurality of storage sections 1 of the purging article storage rack 2 (as seen by a person facing the purging article storage rack 2) is designated as the measurement start point storage section.

The jig storage rack 25 includes a jig storage section 26, a charging portion 27, and an adjusting portion 28.

The jig storage section 26 is configured to store an unused measuring jig 17.

The charging portion 27 includes a battery charger etc. and is configured to store a battery 21 removed from the measuring jig 17. The battery charger can be connected to the stored battery 21 to charge the battery 21.

The adjustment portion 28*a* includes a receiving plate 28*a* for receiving and supporting the measuring jig 17. The receiving plate 28*a* is supported by the jig storage section 26 such that the angular position of the receiving plate 28*a* with respect to the jig storage section 26 of the jig storage rack 25 can be adjusted so that the top surface of the receiving plate 28*a* can be adjusted to be horizontal or level even when the floor is sloped.

Figure 7:
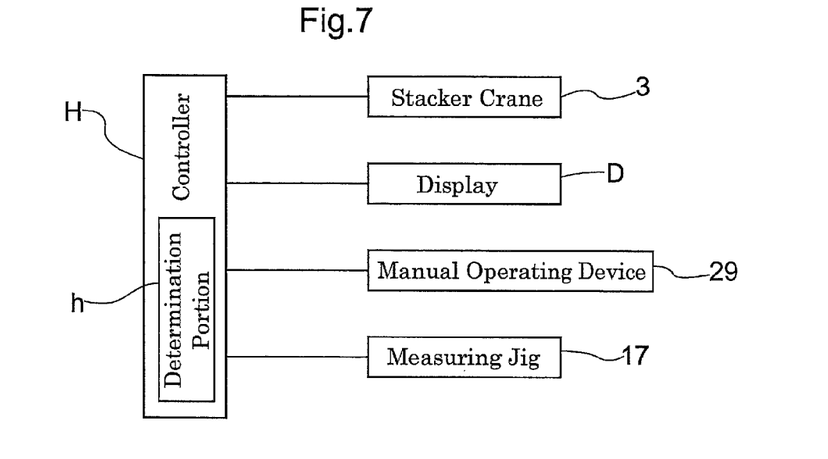
FIG. 7 is a control block diagram.

And the measuring jig 17 is configured to be able to be connected to a controller H by means of a communication cable (not shown) so that when the measuring jig 17 is connected to the controller H with the communication cable, measurement information, including the measured values, etc., which have been obtained by the measuring portion 20 can be transmitted to the controller H.

The controller H which controls the operation of the stacker crane 3 is described next.

A travel stop position which defines a position in the rack lateral direction is defined in advance for each of the plurality of the storage sections 1 and for each of the plurality of the internal transfer locations 4*b*. And a pick up vertical stop position (see FIG. 6) which defines a position in the vertical direction is defined in advance for each of the plurality of the storage sections 1 and for each of the plurality of the internal transfer locations 4*b*. And an unloading vertical stop position (see FIG. 5) which is higher than the corresponding pick up vertical stop position by a set amount is also defined in advance. And information on the travel stop positions, information on the pick up vertical stop positions, and information on the unloading vertical stop positions are stored in the controller H.

When the vertically movable platform 14 is located at the height of the pick up vertical stop position as shown in FIG. 6, the support surface, receiving and supporting a container W, of the article holder 15*a* is located below the top surface of the support body 7 whereas when the vertically movable platform 14 is located at the height of the unloading vertical stop position as shown in FIG. 5, the support surface of the article holder 15*a* is located above the top surface of the support body 7.

The controller H is configured to perform an article transport control for controlling the operation of the stacker crane 3 to transport a container W from a transport origin (a storage section 1 or an internal transfer location 4*b*) to a transport destination (a storage section 1 or an internal transfer location 4*b*), and a tilt measurement control for controlling the operation of the stacker crane 3 to transport the measuring jig 17 sequentially to each of a plurality of measurement target storage sections 1 with all or a portion of the plurality of storage sections 1 designated as the measurement target storage sections 1.

And the controller H includes a functionality to act, in the tilt measurement control, as a determination portion h for determining whether the amount of tilt of the support body 7 as measured by the measuring jig 17 is greater than a permissible angle. The controller H includes this functionality as the determination portion h in the form of a computer program.

In addition, the controller H is connected to a display D, such as a liquid crystal display, for displaying information that identifies a storage section 1 that has the support body 7 that is determined to be tilted by a greater angle than the permissible angle by the determination portion h (this storage section 1 may be referred to hereinbelow as the storage section 1 that has been determined to be anomalous).

The controller H performs an article transport control when a transport command is issued from a superordinate managing means (not shown). In this article transport control, a pick up travel control, a pick up transfer control, an unloading travel control, and an unloading transfer control are performed in that order.

In the pick up travel control, the operation of the stacker crane 3 is controlled to cause the travel carriage 12 to travel to the travel stop position that corresponds to a transport origin and to cause the vertically movable platform 14 to be moved vertically to the pick up vertical stop position that corresponds to the transport origin.

In the pick up transfer control, the operation of the stacker crane 3 is controlled to cause the vertically movable platform 14 to be raised to the unloading vertical stop position that corresponds to the transport origin (state shown in FIG. 5 with dashed lines) after the article holder 15*a* is caused to be projected to the projected position (state shown in FIG. 6 with dashed lines), and subsequently to cause the article holder 15*a* to be retracted to the retracted position (state shown in FIG. 5 with solid lines).

The container W located at the transport origin is transferred onto the article holder 15*a* as a result of performing these pick up travel control and pick up transfer control.

As shown in FIG. 5, in the unloading travel control, the operation of the stacker crane 3 is controlled to cause the travel carriage 12 to travel to the travel stop position that corresponds to a transport destination, and to cause the vertically movable platform 14 to be moved vertically to the unloading vertical stop position that corresponds to the transport destination.

In the unloading transfer control, the operation of the stacker crane 3 is controlled to cause the vertically movable platform 14 to be lowered to the pick up vertical stop position that corresponds to the transport destination (state shown in FIG. 6 with dashed lines) after the article holder 15*a* is caused to be projected to the projected position (state shown in FIG. 5 with dashes lines), and subsequently to cause the article holder 15*a* to be retracted to the retracted position (state shown in FIG. 6 with solid lines).

The container W located on the article holder 15*a* of the transfer device 15 is transferred to the transport destination as a result of performing these unloading travel control and unloading transfer control.

The controller H performs a tilt measurement control in addition to the article transport control described above. In the tilt measurement control, the controller H controls the operation of the stacker crane 3 to transport the measuring jig 17 sequentially to each of the plurality of measurement target storage sections 1 in a set order defined in advance, with all or a portion of the plurality of storage sections 1 designated as the measurement target storage sections 1, such that after causing the measuring jig 17 to be transported to cause the measuring jig 17 to be received and supported by the support body 7 of one measurement target storage section 1, the controller H causes the measuring jig 17 to be transported to cause the measuring jig 17 to be received and supported by the support body 7 of another measurement target storage section 1 that is designated to be the next in the set order defined in advance.

The tilt measurement control performed by the controller H is described next.

The controller H performs an all-rack measurement control and a re-measurement control, as the tilt measurement control.

The all-rack measurement control is a control for controlling the operation of the stacker crane 3 to transport the measuring jig 17 sequentially to each of the measurement target storage sections 1 with all of the plurality of storage sections 1 or a part of the plurality of storage sections 1 that are selected at will designated as the measurement target storage section 1. By performing the all-rack measurement control, the measuring jig 17 is transported sequentially to each and all of the measurement target storage sections 1.

In addition, the re-measurement control is a control for controlling the operation of the stacker crane 3 to transport the measuring jig 17 sequentially to each of the measurement target storage sections 1 with all of the plurality of storage sections 1 that have been determined to be anomalous or a part of the plurality of storage sections 1 that have been determined to be anomalous that are selected at will designated as the measurement target storage sections 1.

To describe in more detail, a screen for selecting one of the all-rack measurement control and the re-measurement control is displayed on the display D when performing the tilt measurement control. And a worker selects either the all-rack measurement control or the re-measurement control using a manual operating device 29, such as a keyboard or a mouse.

When the all-rack measurement control is selected, the addresses for all of the plurality of storage sections 1 are displayed on the display D along with a checkbox for each. And by operating the manual operating device 29 to perform the all-rack measurement control with the checkboxes for all the addresses checked, the all-rack measurement control is performed with all of the plurality of storage sections 1 designated as the measurement target storage sections 1. Incidentally, by operating the manual operating device 29 to perform the all-rack measurement control with one or more of the checkboxes left unchecked, out of the checkboxes for all the addresses for the plurality of the storage sections 1, the all-rack measurement control is performed with only the selected storage sections 1 of the plurality of storage sections 1 designated as the measurement target storage sections 1.

In addition, when the re-measurement control is selected, the addresses for all of the plurality of storage sections 1 that have been determined to be anomalous are displayed on the display D along with a checkbox for each. And by operating the manual operating device 29 to perform the re-measurement control with the checkboxes checked for all the addresses for the storage sections 1 that have been determined to be anomalous, the re-measurement control is performed with all of the plurality of storage sections 1 that have been determined to be anomalous designated as the measurement target storage sections 1. Incidentally, by operating the manual operating device 29 to perform the re-measurement control with one or more of the checkboxes left unchecked, out of the checkboxes for all the addresses for the storage sections 1 that have been determined to be anomalous, the re-measurement control is performed with only the selected storage sections 1 of the storage sections 1 that have been determined to be anomalous designated as the measurement target storage sections 1.

The all-rack measurement control is described next.

A worker places the measuring jig 17 on the support body 7 of the storage section 1 designated as the starting point of the measurement (i.e., the measurement starting point storage section 1) before performing the all-rack measurement control, and initiates the performance, or execution, of the all-rack measurement control with the measuring jig 17 placed on the support body 7 of the storage section 1 designated as the starting point of the measurement. And, by placing the measuring jig 17 on the support body 7 of the measurement starting point storage section 1 designated as the starting point of the measurement, the amount of tilt of the support body 7 in the measurement starting point storage section 1 is measured.

Figure 8:
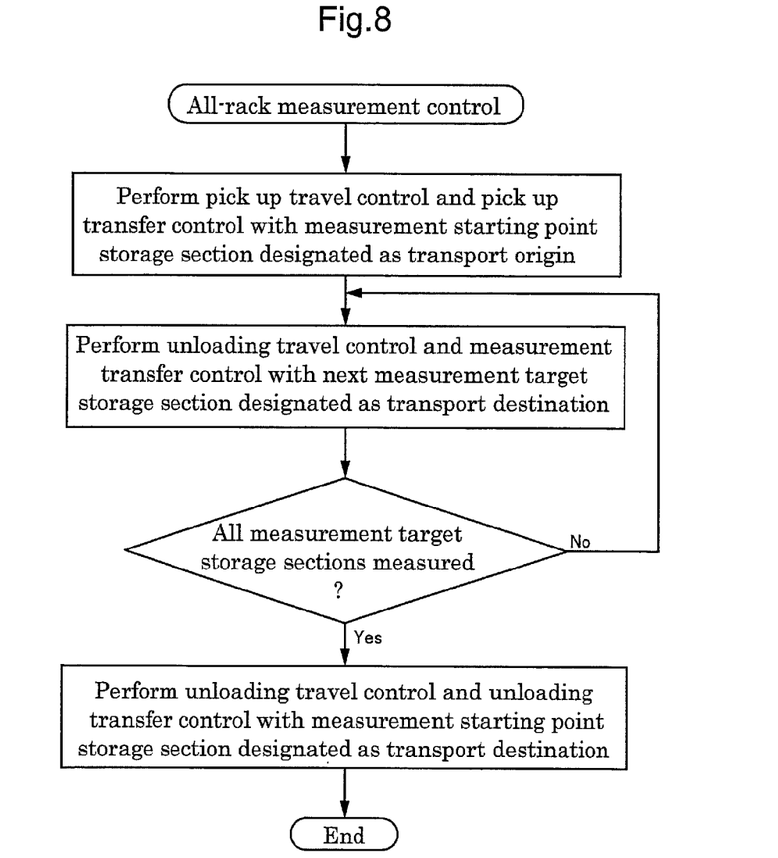
FIG. 8 is a flow chart for an all-rack measurement control.

As shown in the flowchart of FIG. 8, in the all-rack measurement control, a pick up travel control and a pick up transfer control are performed first with the measurement starting point storage section 1 designated as the transport origin. By performing the pick up travel control and the pick up transfer control, the measuring jig 17 located in the measurement starting point storage section 1 is transferred onto the article holder 15*a*.

Next, an unloading travel control and a measurement transfer control are performed with the next measurement target storage section 1 designated as the transport destination.

The operation of the stacker crane 3 is controlled by this measurement transfer control as follows. Specifically, the article holder 15*a* is first caused to be projected from the retracted position (position shown in FIG. 5 with solid lines) to the projected position (position shown in FIG. 5 with dashed lines). Subsequently, the vertically movable platform 14 is lowered to the pick up vertical stop position (position shown in FIG. 6 with dashed lines) that corresponds to the transport destination. And after the vertically movable platform 14 is kept stationary at the pick up vertical stop position for a predetermined movement start set period, the vertically movable platform 14 is raised to the unloading vertical stop position (position shown in FIG. 5 with dashed lines) that corresponds to the transport destination. And subsequently, the article holder 15*a* is retracted to the retracted position (position shown in FIG. 5 with solid lines).

The movement start set period is set or defined to be longer than the measurement start set period. Thus, in the all-rack measurement control, by starting the transporting of the measuring jig 17 to the next measurement target storage section 1 upon or after expiration or elapse of the predetermined movement start set period after the measuring jig 17 is received and supported by the support body 7 of the current measurement target storage section 1, the measurement start set period elapses while the vertically movable platform 14 is kept stationary at the pick up vertical stop position for the movement start set period, allowing the amount of tilt of the support body 7 to be measured by the measuring jig 17.

And the measuring jig 17 is transported sequentially to each of the plurality of measurement target storage sections 1 by repeatedly performing the unloading travel control and the measurement transfer control. And after transporting the measuring jig 17 to all of the measurement target storage sections 1, an unloading travel control and unloading transfer control are performed with the measurement starting point storage section 1 designated as the transport destination.

When the all-rack measurement control performed by the controller H is completed, a worker moves the measuring jig 17 to the adjustment portion 28 of the jig storage rack 25 from the measurement starting point storage section 1, and connects the measuring jig 17 to the controller H with the communication cable to transmit the measurement information measured by the measuring portion 20 to the controller H. The controller H determines, for each of the measurement target storage sections 1, whether the support body 7 is tilted by an amount that is greater than a permissible angle, based on the information on the set order and the measurement information from the measuring jig 17.

The re-measurement control is described next.

As in the all-rack measurement control, when performing this re-measurement control, a worker places the measuring jig 17 on the support body 7 of the measurement starting point storage section 1 before performing the re-measurement control, and initiates the performance, or execution, of the re-measurement control with the measuring jig 17 placed on the support body 7 of the measurement starting point storage section 1. By placing the measuring jig 17 on the support body 7 of the measurement starting point storage section 1 in this manner, the amount of tilt of the support body 7 in the measurement starting point storage section 1 is measured.

In the re-measurement control, a pick up travel control and a pick up transfer control are performed with the measurement starting point storage section 1 designated as the transport origin. By performing the pick up travel control and the pick up transfer control, the measuring jig 17 located in the measurement starting point storage section 1 is transferred onto the article holder 15a.

And the measuring jig 17 is transported sequentially to each of the plurality of measurement target storage sections 1 by repeatedly performing the unloading travel control and the measurement transfer control. And after transporting the measuring jig 17 to all of the measurement target storage sections 1, an unloading travel control and unloading transfer control are performed with the measurement starting point storage section 1 designated as the transport destination.

When the re-measurement control performed by the controller H is completed, a worker moves the measuring jig 17 to the adjustment portion 28 of the jig storage rack 25 from the measurement starting point storage section 1, and connects the measuring jig 17 to the controller H with the communication cable to transmit the measurement information measured by the measuring portion 20 to the controller H.

The controller H determines, for each of the measurement target storage sections 1, whether the support body 7 is tilted by an amount that is greater than the permissible angle, based on information on the storage sections 1 that have been determined to be anomalous and information on the set order and the measurement information obtained by the measuring jig 17.

Incidentally, the set order (of measurement) is defined or set as follows.

Specifically, a priority for the measurement is set such that the storage sections 1 belonging to the purging article storage rack 2 have higher priority than the storage sections 1 belonging to the non-purging article storage rack 2. In addition, the lower the row or level storage sections 1 belong to, the higher the priority the storage sections 1 have for the measurement. In addition, for the storage sections 1 on odd levels, the closer a storage section 1 is to the left end of the rack, the higher priority it has for the measurement whereas, for the storage sections 1 on even levels, the closer a storage section 1 is to the right end of the rack, the higher priority it has for the measurement. And the set order is set or defined based on the priority for the measurement. And the set order is set or defined in the order of priority of the storage sections 1 among the measurement target storage sections 1.

As such, when all of the plurality of storage sections 1 are designated as the measurement target storage sections 1, for example, the set order is set along a winding or zigzag path starting from the lowest row or level and winding upward, as a part of the set order is indicated by the arrow in FIG. 2.

Thus, when the controller H performs the tilt measurement control, the measuring jig 17 is transported sequentially to each of the plurality of measurement target storage sections 1 by the stacker crane 3. And the amount of tilt of the support body 7 can be measured by the measuring jig 17 for each of the measurement target storage sections 1 to which the measuring jig 17 is transported sequentially. Thus, the amount of time required to measure the amount of tilt of the support bodies 7 can be reduced compared to when a human worker takes measurements of support bodies 7 one by one using a level.

Alternative Embodiments (1) In the embodiment described above, the controller H has the functionality of the determination portion h; however, the measurement controller 22 may have the functionality of the determination portion h instead. When the measurement controller 22 has the functionality of the determination portion h and with the measuring jig 17 connected to the controller H with the communication cable, the determined information which is information determined in the determination portion h may be transmitted to the controller H in addition to the measurement information from the measuring jig 17. Alternatively, only the determined information may be transmitted to the controller H from the measuring jig 17.

(2) In the embodiment described above, the display D is provided; however, an alerting device such as a buzzer may be provided in place of the display D.

More specifically, the measuring jig 17 may be provided with the determination portion h as well as an alerting device such as a buzzer and a lamp, etc., for example. And whether the amount of tilt of the support body 7 measured by the measuring portion 20 is greater than the permissible angle is determined by the determination portion h upon measurement of the amount of the tilt of the support body 7 by the measuring portion 20. The arrangement may be such that a worker is alerted by means of the alerting device that there is a support body 7 that is tilted by an angle greater than the permissible angle when the determination portion h determines that the amount of tilt of the support body 7 is greater than the permissible angle.

(3) In the embodiment described above, the location to which the measuring jig 17 is moved in advance is the measurement starting point storage section 1 when performing the tilt measurement control. And the leftmost and lowest storage section 1 of the purging article storage rack 2 (as seen by a person facing the purging article storage rack 2) is designated as the starting point of the measurement (i.e., the measuring starting point storage section 1). However, a storage section 1 at other location may be designated as the measurement starting point storage section 1.

Alternatively, the location to which the measuring jig 17 is moved in advance when performing the tilt measurement control may be the article support portion (internal transfer location 4b) or the article holder 15a of the transfer device 15. Incidentally, when the article support portion is selected as such a location, the first transport origin when performing the tilt measurement control would be the article support portion. And when the article holder 15*a* of the transfer device 15 is selected as such location, the first pick up travel control and the pick up transfer control are not performed when performing the tilt measurement control.

(4) In the embodiment described above, in the tilt measurement control, the controller is configured to start transporting the measuring jig 17 to the next measurement target storage section 1 upon or after expiration or elapse of the predetermined movement start set period after the measuring jig 17 is received and supported by the support body 7 of the current measurement target storage section 1. However, this may be performed as follows instead.

Specifically, the measuring jig 17 may be provided with a transmitting portion for transmitting information which indicates that the measurement is completed. And the vertically movable platform 14 or the transfer device 15 of the stacker crane 3 may be provided with a receiving portion for receiving the information from the transmitting portion. And the information indicating the completion of the measurement may be transmitted from the transmitting portion when the measuring jig 17 completes measurement of the amount of tilt of the support body 7. And in the tilt measurement control, the controller may be configured to start transporting the measuring jig 17 to the next measurement target storage section 1 immediately, or upon or after expiration of a predetermined period, after the receiving portion receives the information indicating the completion of the measurement after the measuring jig 17 is received and supported by the support body 7 of the current measurement target storage section 1.

(5) In the embodiment described above, the measuring jig 17 includes the detecting portion 19 for detecting that the measuring jig 17 is received and supported in the proper attitude by the support body 7. And the measuring portion 20 is configured to measure the amount of tilt of the support body 7 after the measurement start set period has elapsed after the detecting portion 19 detects the resting state of the supported portion 18. However, this may be accomplished as follows instead.

Specifically, the vertically movable platform 14 or the transfer device 15 of the stacker crane 3 is provided with a transmitting portion for transmitting information which indicates that the transporting is completed. And the measuring jig 17 is provided with a receiving portion for receiving the information from the transmitting portion. And after the stacker crane 3 completes transporting the measuring jig 17, the information indicating the completion of the transporting is transmitted to the receiving portion of the measuring jig 17 from the transmitting portion of the stacker crane 3. And the measuring jig 17 may be configured such that the measuring portion 20 starts measuring the amount of tilt of the support body 7 immediately, or upon or after expiration of a predetermined period, after the receiving portion receives the information indicating the completion of the transporting.

(6) In the embodiment described above, the amount of tilt of the support body 7 is measured by the measuring jig 17 while the measuring jig 17 is supported in the same manner as the manner in which an article is supported by the support body 7. However, the amount of tilt of the support body 7 may be measured by the measuring jig 17 while the measuring jig 17 is supported in a manner different from the manner in which an article is supported by the support body 7, such as measuring the amount of tilt of the support body 7 with the measuring jig 17 received and supported directly by the plate member 8, etc.

In addition, the manner in which the support body 7 supports an article may be changed as appropriate. For example, the support body 7 may be a plate-shaped member and the article may be stored with the support body 7 receiving and supporting the entire undersurface of the article.

Also, the articles are FOUPs in the embodiment described above. However, articles may be other objects, such as bulk containers or carton cases.

(7) In the embodiment described above, the all-rack measurement control as well as the re-measurement control are performed as the tilt measurement control. However, only the all-rack measurement control may be performed as the tilt measurement control. It is conceivable, when only the all-rack measurement control is performed, to perform the all-rack measurement control again after corrections of the support bodies are completed, or to have a worker measure, using a stepladder etc., only the storage sections 1 for which the corrections of the support bodies 7 are completed.

Summary of Embodiments Described Above

A brief summary of the article storage facility described above is provided next.

An article storage facility comprises: an article storage rack having a plurality of storage sections for storing articles, the storage sections being arranged along a vertical direction and along a rack lateral direction; an article transport device for transporting articles to the plurality of storage sections; a controller for controlling operation of the article transport device; wherein each of the plurality of storage sections includes a support body for receiving and supporting an article, wherein the controller is configured to perform an article transport control for controlling operation of the article transport device to transport an article between an article support portion and any one of the plurality of the storage sections, wherein a measuring jig is provided for measuring an amount of tilt of the support body with respect to the horizontal with the measuring jig received and supported by the support body, wherein the controller is configured to perform a tilt measurement control for controlling operation of the article transport device to transport the measuring jig sequentially to each of a plurality of measurement target storage sections which is all or a part of the plurality of storage sections, such that, after causing the measuring jig to be transported to cause the measuring jig to be received and supported by the support body of one measurement target storage section, the controller causes the measuring jig to be transported to cause the measuring jig to be received and supported by the support body of another measurement target storage section that is designated as being next in a set order defined in advance.

With the arrangement described above, the measuring jig is transported sequentially to each of the plurality of measurement target storage sections by the article transport device when the controller performs the tilt measurement control. And the measuring jig transported to the measurement target storage section is transported to be caused to be received and supported by the support body; thus, the amount of tilt of the support body with respect to the horizontal can be measured by the measuring jig for each of the measurement target storage sections to which the measuring jig is sequentially transported. A worker can then correct the attitudes of the tilted support bodies to a proper installed state based on the measurements of the measuring jig.

As such, by transporting the measuring jig with the article transport device and measuring the amount of tilt of the support bodies of the plurality of measurement target storage sections, the amount of time required to take the measurements can be reduced compared to when a worker takes measurements while having to climb up and down the stepladder, and to move the stepladder along the rack lateral direction.

In addition, by making use of the article transport device, which is already provided to transport articles, to transport the measuring jig, it is not necessary to provide a separate device for transporting the measuring jig. Thus, any increase in cost that may be associated with the reduction in the amount of time for taking measurements may be reduced.

Here, the controller preferably performs, as the tilt measurement control, an all-rack measurement control in which the measuring jig is transported sequentially to all of the measurement target storage sections, wherein the article storage facility preferably further includes a determination portion for determining, in the all-rack measurement control, whether an amount of tilt of the support body with respect to the horizontal and measured by the measuring jig is greater than a permissible angle, and a display for displaying information which specifies a storage section having the support body that is determined to be tilted by an angle greater than the permissible angle, by the determination portion.

With the arrangement described above, the measuring jig is transported sequentially to all of the measurement target storage sections when the controller performs the all-rack measurement control. Thus, the amount of tilt of the support bodies in all of the measurement target storage sections can be measured by the measuring jig.

And the determination portion determines, in the all-rack measurement control, whether the amount of tilt of the support body with respect to the horizontal and measured by the measuring jig is greater than a permissible angle. And the display displays information which specifies any storage section having the support body that is determined to be tilted by an angle greater than the permissible angle, by the determination portion.

Thus, by checking the information displayed on the display, a worker can identify any and all storage sections, among the plurality of storage sections, with the support body that is determined to be tilted by an angle greater than the permissible angle. Thus the worker can correct or adjust all the support bodies that are determined to be tilted by an angle greater than the permissible angle to the proper installed state at once; therefore, the support bodies can be corrected or adjusted with greater efficiency compared to interrupting the all-rack measurement control each time a support body is measured by the measuring jig to be tilted by an angle greater than the permissible angle, in order to correct a tilted support body to the proper installed state.

Also, in addition to the all-rack measurement control, the controller preferably performs, as the tilt measurement control, a re-measurement control in which the measuring jig is transported sequentially to each of measurement target storage sections that only include storage sections each having the support body that is determined to be tilted by an angle greater than the permissible angle by the determination portion.

With the arrangement described above, in the re-measurement control, the measurement target storage sections include, among the plurality of storage sections, only storage sections having the support body that is determined to be tilted by an angle greater than the permissible angle by the determination portion. Thus, by performing the re-measurement control, the measuring jig is transported sequentially to each of the storage sections having the support body that is determined to be tilted by an angle greater than the permissible angle by the determination portion; thus, the support bodies that are determined, based on the measurements from the all-rack measurement control, to be tilted by an angle greater than the permissible angle by the determination portion can be measured again by the measuring jig.

In other words, after a worker corrects the support bodies, that have been determined to be tilted by an angle greater than the permissible angle by the determination portion, to the proper installed state, the control means can perform the re-measurement control to confirm whether the tilted support bodies have been corrected or adjusted to the proper installed state. In addition, the amount of time required to take measurements can be reduced when the confirmation of whether the tilted support bodies have been corrected or adjusted to the proper installed state is done by performing the re-measurement control, in lieu of performing the all-rack measurement control.

In addition, the controller preferably controls, in the tilt measurement control, operation of the article transport device to start transporting the measuring jig to the another measurement target storage section that has been designated as being next after expiration of a predetermined movement start set period after the measuring jig is received and supported by the support body of the one measurement target storage section.

With the arrangement described above, after expiration of the predetermined movement start set period after the measuring jig is received and supported by the support body of one measurement target storage section, the transporting of the measuring jig to the next measurement target storage section is started. By setting this movement start set period to be longer or greater than the amount of time required to measure the amount of tilt of the support body with the measuring jig after the measuring jig is received and supported by the support body, the measurement of the amount of tilt of the support body of the measurement target storage section with the measuring jig would be completed before the transporting of the measuring jig to the next measurement target storage section is started after expiration of the predetermined movement start set period after the measuring jig is received and supported by the support body of the measurement target storage section.

In other words, it is not necessary to transmit information, that indicates that the measurement has been completed, from the measuring jig to the article transport device after the measuring jig completes the measurement of the amount of tilt of the support body. Therefore, there is no need to provide either the article transport device or the measuring jig with any device to transmit such information, thus simplifying the structure of the article transport device or the measuring jig.

In addition, the measuring jig preferably includes a detecting portion for detecting a resting state of the measuring jig with respect to the support body, and a measuring portion for measuring an amount of tilt of the support body with respect to the horizontal, wherein measurement by the measuring portion is preferably performed after expiration of a measurement start set period after the detecting portion detects that the measuring jig is received and supported by the support body in a proper attitude defined in advance, and wherein the measurement start set period is preferably set to be less than the movement start set period.

With the arrangement described above, when the article transport device causes the measuring jig to be received and supported by the support body of a measurement target storage section, the resting state of the measuring jig with respect to the support body is detected by the detecting portion. And the amount of tilt of the support body is measured by the measuring portion after expiration of the measurement start set period after the resting state is detected by the detecting portion as described above.

In other words, it is not necessary to transmit information, that indicates that the transporting has been completed, from the article transport device to the measuring jig after the measuring jig has been transported to the measurement target storage section by the article transport device. Therefore, there is no need to provide either the article transport device or the measuring jig with any device to transmit such information, thus simplifying the structure of the article transport device or the measuring jig.

In addition, the support body preferably includes a plurality of support members for receiving and supporting an article in a proper attitude defined in advance, wherein the measuring jig preferably includes a supported portion received and supported by the plurality of support members in the proper attitude, and a measuring portion supported by the supported portion, and wherein the measuring portion preferably measures an amount of tilt of the support body with respect to the horizontal.

With the arrangement described above, the support body of the storage section is configured to receive and support an article in the proper attitude by means of the plurality of support members. And thus the supported portion of the measuring jig is received and supported in the proper attitude by the plurality of support members of the support body.

In other words, the measuring jig transported to the storage section assumes an attitude of being received and supported by the plurality of support members, as in the case of an article stored in the storage section. And measuring of the amount of tilt of the support body in the same attitude assumed by an article facilitates proper measurement of the amount of tilt of the support body by the measuring jig.

What is claimed is:

1. An article storage facility comprising:
   an article storage rack having a plurality of storage sections for storing articles, the storage sections being arranged along a vertical direction and along a rack lateral direction;
   an article transport device for transporting articles to the plurality of storage sections;
   a controller for controlling operation of the article transport device;
   wherein each of the plurality of storage sections includes a support body for receiving and supporting an article,
   wherein the controller is configured to perform an article transport control for controlling operation of the article transport device to transport an article between an article support portion and any one of the plurality of the storage sections,
   wherein a measuring jig is provided for measuring an amount of tilt of the support body with respect to the horizontal with the measuring jig received and supported by the support body, and
   wherein the controller is configured to perform a tilt measurement control for controlling operation of the article transport device to transport the measuring jig sequentially to each of a plurality of measurement target storage sections which is all or a part of the plurality of storage sections, such that, after causing the measuring jig to be transported to cause the measuring jig to be received and supported by the support body of one measurement target storage section, the controller causes the measuring jig to be transported to cause the measuring jig to be received and supported by the support body of another measurement target storage section that is designated as being next in a set order defined in advance.

2. The article storage facility as defined in claim 1, wherein
   the controller performs, as the tilt measurement control, an all-rack measurement control in which the measuring jig is transported sequentially to all of the measurement target storage sections,
   wherein the article storage facility further includes a determination portion for determining, in the all-rack measurement control, whether an amount of tilt of the support body with respect to the horizontal and measured by the measuring jig is greater than a permissible angle, and a display for displaying information which specifies a storage section having the support body that is determined to be tilted by an angle greater than the permissible angle, by the determination portion.

3. The article storage facility as defined in claim 2, wherein
   in addition to the all-rack measurement control, the controller performs, as the tilt measurement control, a re-measurement control in which the measuring jig is transported sequentially to each of measurement target storage sections that only include storage sections each having the support body that is determined to be tilted by an angle greater than the permissible angle by the determination portion.

4. The article storage facility as defined in claim 1, wherein
   the controller controls, in the tilt measurement control, operation of the article transport device to start transporting the measuring jig to the another measurement target storage section that has been designated as being next after expiration of a predetermined movement start set period after the measuring jig is received and supported by the support body of the one measurement target storage section.

5. The article storage facility as defined in claim 4, wherein
   the measuring jig includes a detecting portion for detecting a resting state of the measuring jig with respect to the support body, and a measuring portion for measuring an amount of tilt of the support body with respect to the horizontal,
   wherein measurement by the measuring portion is performed after expiration of a measurement start set period after the detecting portion detects that the measuring jig is received and supported by the support body in a proper attitude defined in advance, and
   wherein the measurement start set period is set to be less than the movement start set period.

6. The article storage facility as defined in claim 1, wherein
   the support body includes a plurality of support members for receiving and supporting an article in a proper attitude defined in advance, and
   wherein the measuring jig includes a supported portion received and supported by the plurality of support members in the proper attitude, and a measuring portion supported by the supported portion, and
wherein the measuring portion measures an amount of tilt of the support body with respect to the horizontal.

* * * * *